US012588469B2

(12) United States Patent
Li et al.

(10) Patent No.: US 12,588,469 B2
(45) Date of Patent: Mar. 24, 2026

(54) BIPOLAR ELECTROSTATIC CHUCK ELECTRODE WITH SELF-INDUCED DC VOLTAGE

(71) Applicant: Applied Materials, Inc., Santa Clara, CA (US)

(72) Inventors: Jian Li, Fremont, CA (US); Deenesh Padhi, Saratoga, CA (US); Abhishek Kumar Verma, Santa Clara, CA (US); Kallol Bera, Fremont, CA (US); Juan Carlos Rocha-Alvarez, San Carlos, CA (US); Wenhao Zhang, San Jose, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 18/485,182

(22) Filed: Oct. 11, 2023

(65) Prior Publication Data

US 2025/0125180 A1 Apr. 17, 2025

(51) Int. Cl.
H01L 21/683 (2006.01)
H01J 37/32 (2006.01)
H01L 21/67 (2006.01)

(52) U.S. Cl.
CPC .... H01L 21/6833 (2013.01); H01J 37/32174 (2013.01); H01J 37/32724 (2013.01); H01L 21/67248 (2013.01)

(58) Field of Classification Search
CPC ............ H01L 21/6833; H01L 21/67248; H01J 37/32174; H01J 37/32724; H01J 37/32715

(Continued)

(56) References Cited

U.S. PATENT DOCUMENTS 5,708,250 A * 1/1998 Benjamin .............. H02N 13/00
269/903
5,886,866 A * 3/1999 Hausmann .......... H01L 21/6833
279/128

(Continued)

FOREIGN PATENT DOCUMENTS

CN 114975219 A 8/2022
KR 20230089877 A 6/2023

OTHER PUBLICATIONS

PCT/US2024/050113, "International Search Report and Written Opinion", Jan. 14, 2025, 10 pages.

(Continued)

*Primary Examiner* — Sreeya Sreevatsa
(74) *Attorney, Agent, or Firm* — Kilpatrick Townsend & Stockton LLP

(57) ABSTRACT

Substrate support assemblies may include an electrostatic chuck body defining a substrate support surface that defines a substrate seat. Assemblies may include a support stem coupled with the electrostatic chuck body. Assemblies may include a first bipolar electrode embedded within the electrostatic chuck body. Assemblies may include a second bipolar electrode embedded within the electrostatic chuck body radially inward of at least a portion of the first bipolar electrode and coaxial with the first bipolar electrode. Assemblies may include an annular electrode disposed about the first bipolar electrode, where the annular electrode is DC floated and RF powered and exhibits an induced DC current.

20 Claims, 4 Drawing Sheets

(58) Field of Classification Search
USPC ........................................................ 361/234
See application file for complete search history.

(56) References Cited

U.S. PATENT DOCUMENTS

| | | | | |
|---|---|---|---|---|
| 8,607,731 | B2 * | 12/2013 | Hoffman | ............. H01L 21/6833 |
| | | | | 118/728 |
| 2006/0158821 | A1 * | 7/2006 | Miyashita | ............. H01L 21/683 |
| | | | | 361/233 |
| 2009/0314433 | A1 | 12/2009 | Hoffman et al. | |
| 2021/0098239 | A1 * | 4/2021 | Tamura | ............. H01J 37/32642 |
| 2021/0175108 | A1 | 6/2021 | Verbaas | |
| 2022/0122875 | A1 * | 4/2022 | Li | ..................... H01L 21/67103 |
| 2022/0351942 | A1 * | 11/2022 | Wang | ................ H01J 37/32091 |

OTHER PUBLICATIONS

Taiwanese Application No. 113138714, Office Action mailed on Jul. 11, 2025, 13 pages (1 page of English Translation and 12 pages of Original Copy).

* cited by examiner

BIPOLAR ELECTROSTATIC CHUCK ELECTRODE WITH SELF-INDUCED DC VOLTAGE

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. For example, higher temperatures may lead to higher deposition rates. Therefore, any temperature non-uniformity across the substrate support may result in film thickness uniformity issues on the wafer.

Thus, there is a need for improved systems and methods that can be used to produce high quality devices and structures. These and other needs are addressed by the present technology.

SUMMARY

The present technology is generally directed to substrate support assemblies. Assemblies include an electrostatic chuck body defining a substrate support surface that defines a substrate seat. Assemblies include a support stem coupled with the electrostatic chuck body. Assemblies include a first bipolar electrode embedded within the electrostatic chuck body. Assemblies include a second bipolar electrode embedded within the electrostatic chuck body radially inward of at least a portion of the first bipolar electrode and coaxial with the first bipolar electrode. Assemblies include an annular electrode disposed about the first bipolar electrode, where the annular electrode is DC floated and RF powered and exhibits an induced DC current.

In embodiments, assemblies include a mesh disposed within the electrostatic chuck body, the mesh coupling the annular electrode with an RF power supply, where one or more leads couple the mesh with the annular electrode. In more embodiments, a distance between the mesh and the annular electrode is from about 0.6 mm to about 8 mm. Furthermore, in embodiments, the distance between the mesh and the annular electrode is from about 1 mm to about 4.5 mm. In yet more embodiments, the annular electrode exhibits a negative floating DC voltage of less than 0 V to about −600 V. Additionally or alternatively, in embodiments, the first bipolar electrode exhibits a generally annular shape and the second bipolar electrode exhibits a generally circular shape. In embodiments, the first bipolar electrode has a first surface area and the second bipolar electrode has a second surface area, wherein the first surface area and the second surface area vary by less than or about 10%. Furthermore, in embodiments, the second bipolar electrode has a radial width and the first bipolar electrode has a width along a radius of the substrate support surface, where the radial width of the second bipolar electrode is greater than a width of the first bipolar electrode. Embodiments include a bridge mesh disposed within the electrostatic chuck body, the bridge mesh coupling the first bipolar electrode with a DC power supply, where one or more leads couple the bridge mesh with the first bipolar electrode. In embodiments, the bridge mesh is spaced apart from the mesh of the annular electrode by an amount of at least about 0.6 mm to about 8 mm. Moreover, in embodiments, each of the first bipolar electrode and the second bipolar electrode is coupled with at least one RF power supply and each of the first bipolar electrode and the second bipolar electrode is coupled with at least one DC power supply and all of the second bipolar electrode is disposed radially inward of the first bipolar electrode.

The present technology is also generally directed to substrate support assemblies. Assemblies include an electrostatic chuck body defining a substrate support surface that defines a substrate seat. Assemblies include a support stem coupled with the electrostatic chuck body. Assemblies include a first bipolar electrode embedded within the electrostatic chuck body. Assemblies include a second bipolar electrode embedded within the electrostatic chuck body radially inward of at least a portion of the first bipolar electrode and coaxial with the first bipolar electrode. Assemblies include an annular electrode disposed about the first bipolar electrode, wherein the annular electrode is DC floated and RF powered. Assemblies include a mesh disposed within the electrostatic chuck body, the mesh coupling the annular electrode with an RF power supply, where a distance between the mesh and the annular electrode is from about 0.6 mm to about 8 mm.

In embodiments, a distance between the mesh and the annular electrode is from about 0.75 mm to about 1.5 mm and the annular electrode exhibits a floating DC voltage of about 100 V to about −100 V. In more embodiments, a distance between the mesh and the annular electrode is from about 1.5 mm to about 6 mm and the annular electrode exhibits a floating DC voltage of about −50 V to about −600 V. Furthermore, in embodiments, the distance between the mesh and the annular electrode is from about 1.5 mm to about 4.5 mm. Additionally or alternatively, embodiments include a bridge mesh disposed within the electrostatic chuck body, the bridge mesh coupling the first bipolar electrode with a DC power supply, where one or more leads couple the bridge mesh with the first bipolar electrode. In embodiments, the bridge mesh is spaced apart from the mesh of the annular electrode by an amount of at least about 0.6 mm to about 8 mm.

The present technology is also generally directed to substrate support assemblies. Assemblies include an electrostatic chuck body defining a substrate support surface that defines a substrate seat. Assemblies include a support stem coupled with the electrostatic chuck body. Assemblies include a first bipolar electrode embedded within the electrostatic chuck body, where the first bipolar electrode is coupled with at least one DC power supply and is supplied with a negative DC current. Assemblies include a second bipolar electrode embedded within the electrostatic chuck body wherein an entirety of the second bipolar electrode is radially inward of at least a portion of the first bipolar electrode and the second bipolar electrode is coaxial with the first bipolar electrode. Assemblies include an annular electrode disposed about the first bipolar electrode, where the annular electrode is DC floated and RF powered and exhibits an induced DC current.

In embodiments, a mesh disposed within the electrostatic chuck body, the mesh coupling the annular electrode with an RF power supply, where a distance between the mesh and the annular electrode is from about 0.6 mm to about 8 mm. In more embodiments, a bridge mesh disposed within the electrostatic chuck body, the bridge mesh coupling the first bipolar electrode with a DC power supply, where the mesh is disposed vertically above or below the bridge mesh.

Such technology may provide numerous benefits over conventional systems and techniques. For example, embodiments of the present technology may provide substrate supports with reduced damage risk at an outer edge. This may help improve the performance across the substrate support and subsequently improve the film thickness uniformity on wafer. Additionally, the substrate supports may exhibit such features without requiring a third DC power supply to an edge region. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
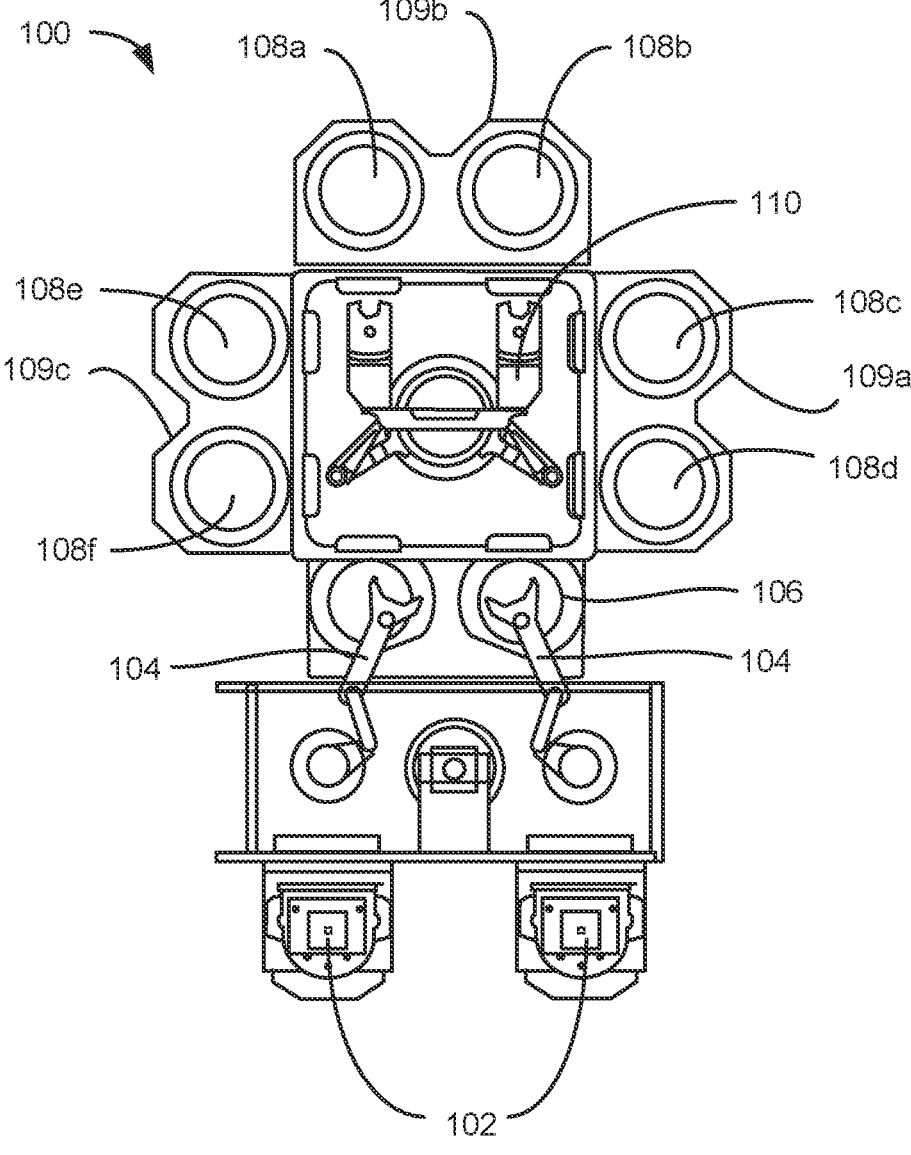
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. These formed films may be produced under conditions that cause stresses on the substrate. An electrostatic chuck may be used to produce a clamping action against the substrate to overcome the bowing stress. However, as semiconductor processing continues to increase precision and reduce device sizes, chucking may participate in issues with processing. For example, uneven current flow, particularly at narrow portions of an electrode through which much of the current passes, may generate temperature non-uniformities (e.g., hot spots) across the substrate support. These hot spots may cause high deposition rates proximate such regions, which may create film non-uniformity issues on wafer. Additionally, conventional bipolar electrode designs used for chucking, such as two semicircular electrodes that extend to or beyond the wafer edge, may cause undesired generation of DC plasma, electrical discharge (e.g., arcing), and/or may discolor the substrate support, particularly on a side of the positive DC charge.

Attempts have been made to correct the undesired generation of DC plasma and electrical discharge by reducing the size of the electrode(s) to exhibit a smaller footprint than the substrate. However, such orientations failed to provide adequate plasma uniformity at edge regions, contributing to film non-uniformity, and also failed to protect the edges from damage due to the lack of negative charge. Moreover, attempts were made to include a third electrode or further electrode extending around the center electrode(s) around an exterior perimeter of the substrate support, that only provided RF charge without DC charge. However, such orientations failed to provide adequate protection to the substrate support, as no DC charge is present, allowing ions to damage the surface of the substrate support. Existing systems have included a third power source to the outer electrode in an effort to alleviate this problem. However, such solutions are susceptible to shorting due to close contact between adjacent lines, and have proven difficult to provide within the constraints of semiconductor processing chambers.

The present technology overcomes these challenges with substrate support assemblies having bipolar chucking capabilities and include an orientation of electrodes that allows for a self-induced DC voltage to be formed on an outer electrode. Namely, the present technology has surprisingly found that by carefully controlling the orientation of the positive and negative DC electrodes, as well as a distance between the outer electrode mesh and one or more of the positive or negative DC electrode mesh, tailored DC voltage can be induced at the outer electrode without requiring a DC power supply. Additionally, the present technology may implement RF electrode configurations that reduce issues associated with DC currents (and in particular opposing DC currents) being present radially outward of a wafer. The RF electrode configurations may facilitate more uniform RF fields and subsequently more uniform plasma deposition across the wafer, including edge regions of the wafer, while also reducing undesired generation of DC plasma, electrical discharge (e.g., arcing), and/or may discolor the substrate support.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
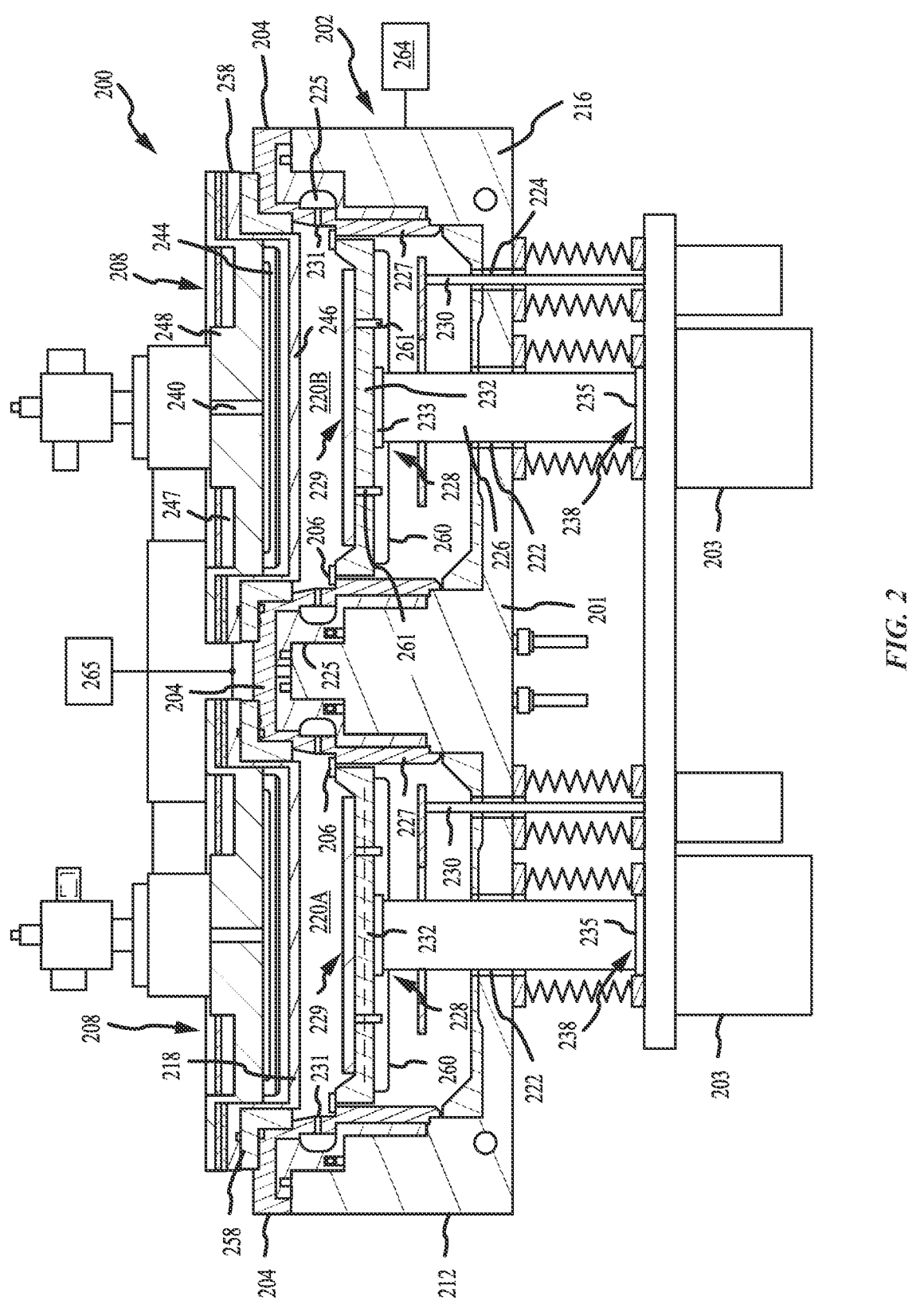
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
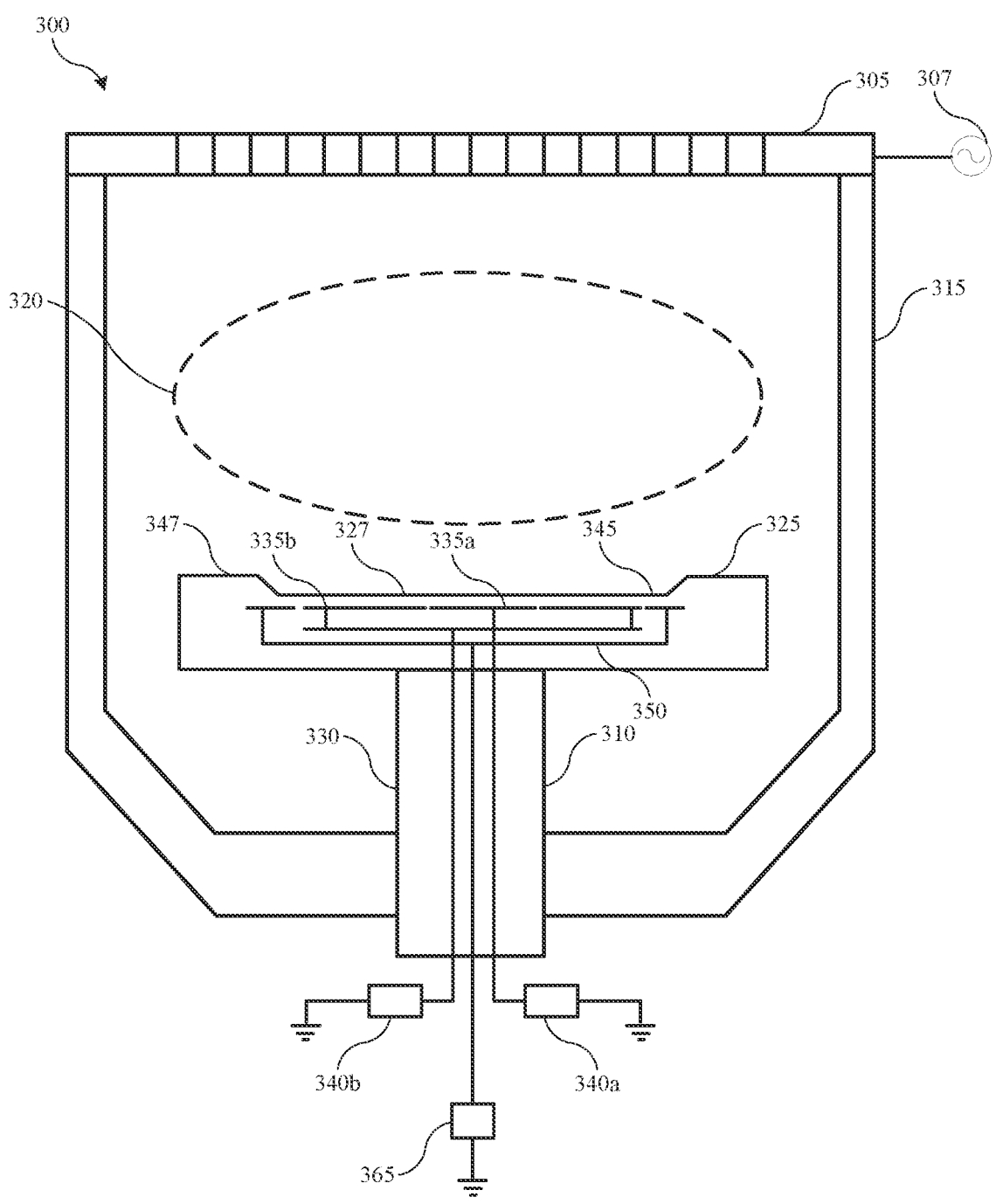
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2 and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include a first bipolar electrode 335a, which may be embedded within the chuck body proximate the substrate support surface. Electrode 335a may be electrically coupled with a DC power source 340a which may also include an RF power source. Power source 340a may be configured to provide energy or voltage to the electrically conductive chuck electrode 335a. For example, electrode 335a may be a chucking mesh that operates as an electrical ground for a capacitive plasma system including an RF source 307 electrically coupled with showerhead 305. In embodiments, electrode 335a may operate as a ground path for RF power from the RF source 307, while also operating as an electric bias to the substrate to provide electrostatic clamping of the substrate to the substrate support surface. Power source 340a may include a filter, a power supply, and a number of other electrical components configured to provide a chucking voltage.

The electrostatic chuck body may also include a second bipolar electrode 335b, which may also be embedded within the chuck body proximate the substrate support surface. Electrode 335b may be electrically coupled with a DC power source 340b which may also include an RF power source. Power source 340b may be configured to provide energy or voltage to the electrically conductive chuck electrode 335b. Electrode 335b may additionally or in alternative to electrode 335a, be a chucking mesh that operates as an electrical ground for a capacitive plasma system including an RF source 307 electrically coupled with showerhead 305. In embodiments, electrode 335b may additionally or in alternative to electrode 335a, operate as a ground path for RF power from the RF source 307, while also operating as an electric bias to the substrate to provide electrostatic clamping of the substrate to the substrate support surface. Power source 340b may include a filter, a power supply, and a number of other electrical components configured to provide a chucking voltage.

Furthermore, as will be discussed in greater detail below, electrostatic chucks according to the present technology may also include a third electrode 350, which may also be embedded within the chuck body proximate the substrate surface. However, electrode 350 may not be in contact with a DC power source, and may instead only be coupled with a RF power source 365. Power source 365 may be configured to provide energy to the third electrode 350. Electrode 350 may additionally or in alternative to electrode 335a and/or 335b be a chucking mesh that operates as an electrical ground for a capacitive plasma system including an RF source 307 electrically coupled with showerhead 305. In embodiments, electrode 350 may additionally or in alternative to electrode 335a and/or 335b, operate as a ground path for RF power from the RF source 307, while also operating as an electric bias to the substrate to provide electrostatic clamping of the substrate to the substrate support surface. Power source 340b may include a filter, a power supply, and a number of other electrical components configured to provide a chucking voltage. Additionally electrical components and details about bipolar chucks according to some embodiments will be described further below, and any of the designs may be implemented with processing chamber 300. For example, additional plasma related power supplies or components may be incorporated as will be explained further below.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340a and 340b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. However, as discussed above, it should be clear that, in embodiments the substrate support may be generally planar, and may not include a recessed region 345. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials.

For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater contained within the chuck body. In some embodiments the electrode 335a and/or 335b may be operated as the heater, but by decoupling these operations, more individual control may be afforded, and extended heater coverage may be provided while limiting the region for plasma formation. Nonetheless, a heater may include multiple heaters in embodiments, and each heater may be associated with a zone of the chuck body, and thus exemplary chuck bodies may include a similar number or greater number of zones than heaters.

A heater, when utilized may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Figure 4A:
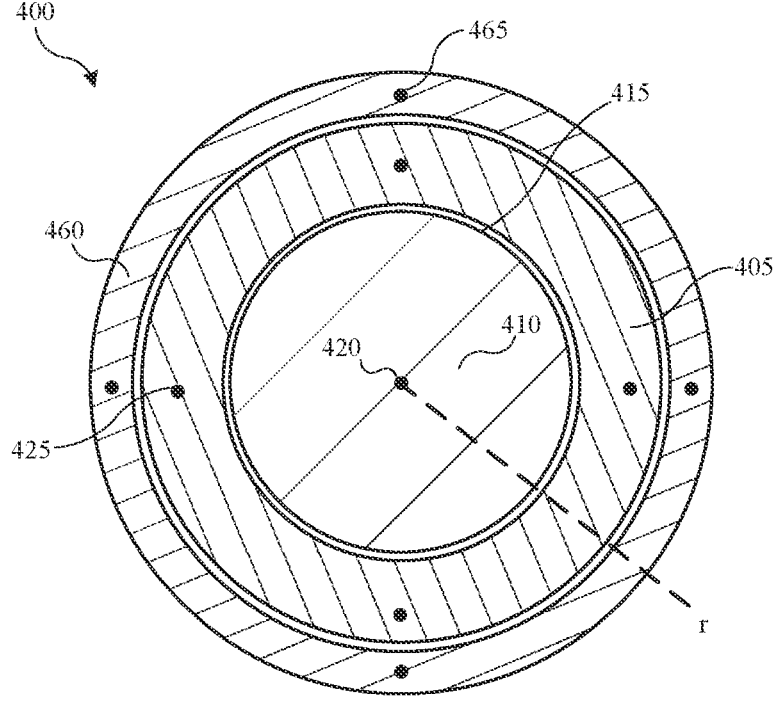
FIG. 4A shows a schematic top plan view of an electrode arrangement for an exemplary substrate support assembly according to some embodiments of the present technology.
Figure 4B:
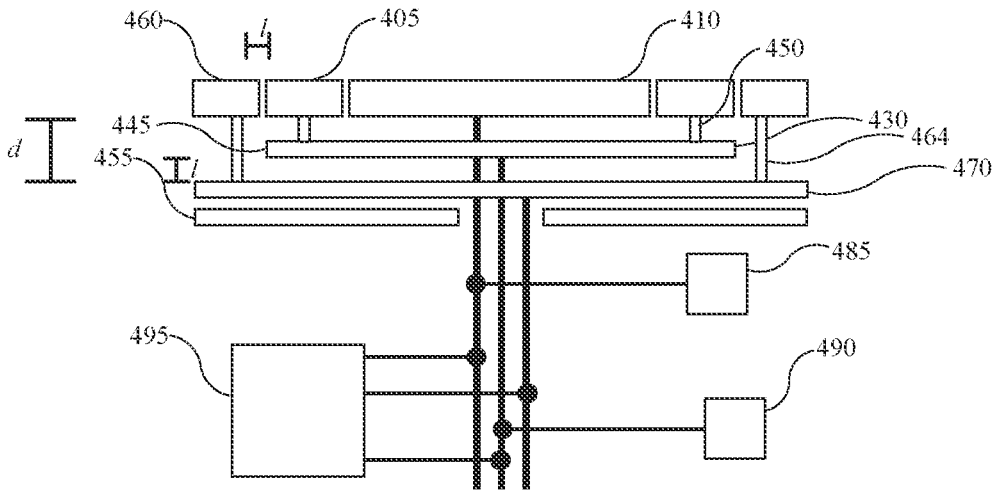
FIG. 4B shows a schematic partial cross-sectional view of an electrode arrangement for an exemplary substrate support assembly according to some embodiments of the present technology.

FIG. 4A shows a schematic top view of an electrode arrangement 400 for an exemplary substrate support assembly according to some embodiments of the present technology and FIG. 4B shows a schematic partial cross-sectional view of electrode arrangement 400 for an exemplary substrate support assembly according to some embodiments of the present technology. Electrodes in arrangement 400 may be any of the electrodes previously described, such as may be included in substrate support assembly 310, or any other number of pedestals or chucks. The electrodes may be operable as an electrostatic chuck as discussed above, and as will be further described below. As illustrated, electrode arrangement 400 may include a first bipolar electrode 405, and a second bipolar electrode 410. The electrodes may be embedded in a puck or chuck body as described above, such as a ceramic including aluminum nitride, and may be characterized by any of the features, configurations, or characteristics as discussed above for any substrate support. In some embodiments, the electrodes 405, 410 may be embedded between a heater 455 (shown in FIG. 4B) and a substrate support surface, however other embodiments may position the electrodes 405, 410 at other locations relative to the heater or omit the heater entirely.

First bipolar electrode 405 and second bipolar electrode 410 may each include a mesh material that may be substantially coplanar across both electrodes within the electrostatic chuck. The mesh materials may be characterized by any number of shapes or geometries. As illustrated, the first bipolar electrode 405 has a generally annular shape and extends about a generally circular second bipolar electrode 410, however other shapes such as rectangles, or any other shape may be used, which may be at least in part determined from substrate geometries, for example. The entirety of the second bipolar electrode 410 may be radially inward of the first bipolar electrode 405, and the two bipolar electrodes 405, 410 may be coaxial in some embodiments.

The second bipolar electrode 410 may have a diameter of between about 5 inches and 10 inches, between about 6 inches and 9 inches, or between about 7 inches and 8 inches, although other diameters are possible in some embodiments. The first bipolar electrode 405 may have an outer diameter of between about 10 inches and 14 inches, between about 10.5 inches and 13.5 inches, between about 11 inches and 13 inches, or between 11.5 inches and 12.5 inches. The first bipolar electrode 405 and second bipolar electrode 410 may be spaced apart in a radial direction by a gap 415. The gap 415 may be between about 1 mm and 5 mm, between about 2 mm and 4 mm, or about 3 mm in some embodiments. Thus, in embodiments, an inner diameter of the first bipolar electrode 405 may be larger than the diameter of the second bipolar electrode 410 according to one or more of the gap 415 widths.

As discussed above, by creating asymmetry between the first bipolar electrode 405 and second bipolar electrode 410, alone or in combination with the coaxial relationship discussed herein, it was surprisingly found that an induced DC current can be formed in RF electrode 460. Thus, in embodiments, the first bipolar electrode 405 and second bipolar electrode 410 may have surface areas that vary from one another by less than or about 10%, such as less than or about 9%, such as less than or about 8%, such as less than or about 7%, such as less than or about 6%, such as less than or about 5%, such as less than or about 4%, such as less than or about 3%, such as less than or about 2%, such as less than or about 1%, or any ranges or values therebetween. Namely, by forming the first bipolar electrode 405 and second bipolar electrode 410 to have generally equal overall surface areas, the RF current may be evenly distributed across the substrate support, providing for reduced variations in temperature and film properties.

However, while the surface area is maintained in a consistent manner, the width of the respective first bipolar electrode 405 and second bipolar electrode 410 moving along one or more radii r of the substrate support may be selected to be variable while utilizing one or more of the diameters discussed above. For instance, by utilizing a greater width in second bipolar electrode 410 than first electrode 405, a DC charge may be exhibited in the RF electrode 460 due to the asymmetry between the first bipolar electrode 405 and second bipolar electrode 410. In embodiments, second bipolar electrode 410 may have a positive voltage and first bipolar electrode 405 may have a negative voltage, which may induce a positive voltage in the RF electrode 460. However, as will be discussed in greater detail below, the DC voltage of the RF electrode may also be tailored by utilizing components and systems according to the present technology.

Electrode leads may couple one or more power sources with the mesh of each of the first bipolar electrode 405 and the second bipolar electrode 410. For example, the second bipolar electrode 410 may be coupled with one or more power sources at one or more positions 420 that may be proximate a center of the second bipolar electrode 410 or at any other position along the mesh in some embodiments. The first bipolar electrode 405 may be coupled with one or more power sources at one or more positions about the circumference of the first bipolar electrode 405. For example, as illustrated the first bipolar electrode 405 may be coupled with power sources at a number of positions 425 that are spaced at even angular intervals about the first bipolar electrode 405. In other embodiments, one or more positions 425 may be positioned at irregular intervals about the first bipolar electrode 405. The first bipolar electrode 405 may include any number of positions 425. For example, the first bipolar electrode 405 may include one or more positions, two or more positions, three or more positions, four or more positions, five or more positions, six or more positions, seven or more positions, eight or more positions, nine or more positions, ten or more positions, eleven or more positions, twelve or more positions, or more.

In some embodiments, to facilitate the coupling between the first bipolar electrode 405 and the one or more power sources, the chuck body may include a bridge mesh 430 that is embedded within and/or otherwise disposed within the electrostatic chuck body. For example, the bridge mesh 430 may be embedded within the chuck body between the substrate support surface and the heater. A power coupling may extend through a stem or shaft of the chuck body and couple with the bridge mesh 430 and a number of conductive elements 450 may couple with the first bipolar electrode 405. The bridge mesh 430 may extend radially outward a sufficient distance such that an outer edge of the bridge mesh 430 may be positioned underneath a portion of the first bipolar electrode 405. The outer edge of the bridge mesh 430 may include a number of conductive elements 450, such as pins, straps, and/or other connective elements that may extend upward and couple with the first bipolar electrode 405 at positions 425 to electrically couple the first bipolar electrode 405 with the one or more power sources. In some embodiments, the outer edge(s) 445 of bridge mesh 430 may have a same outer diameter as the first bipolar electrode 405, while in other embodiments, the outer diameter of the edge(s) 445 may be greater than or less than a diameter of the first bipolar electrode 405, with a portion of the outer edge 445 being directly under the first bipolar electrode 405. In some embodiments, the bridge mesh may have a diameter of between about 0.5 inches and 3.5 inches, between or about 1 inch and 3 inches, or between or about 1.5 inches and 2.5 inches. In some embodiments, one or more of the leads that couple with the positions 420 of the second bipolar electrode 410 may extend through the bridge mesh 430. For example, the bridge mesh 430 may define one or more apertures through a thickness of the bridge mesh 430 that enable leads, rodes, and/or other electrical connectors to pass through the bridge mesh 430 to couple with the second bipolar electrode 410.

The bridge mesh 430 may include any number of conductive elements 450. For example, in some embodiments the bridge mesh 430 may include three or more conductive elements, four or more conductive elements, five or more conductive elements, six or more conductive elements, seven or more conductive elements, eight or more conductive elements, or more. In some embodiments, the bride mesh may extend in a generally continuous manner from a central location, or may have the form of one or more outwardly extending spokes. In such an embodiment, each spoke may have a constant width from a central axis to the outer edge 445. In other embodiments, a width of each spoke may vary along a length of the spoke. For example, each spoke may be more narrow proximate the central axis and taper to a wider portion proximate the outer edge 445. In some embodiments, a width (or minimum width) of each spoke may be at least 5 mm, such as between about 5 mm and 40 mm, between about 10 mm and 35 mm, between about 15 mm and 30 mm, or between about 20 mm and 25 mm, although wider spokes (e.g., spokes with widths of greater than 40 mm, greater than 45 mm, greater than 50 mm, greater than 60 mm, greater than 70 mm, greater than 80 mm, greater than 90 mm, greater than 100 mm, or more) may be possible in some embodiments. As a number of the spokes increases, a width of each spoke may decrease, as the amount of current being distributed through each spoke is divided amongst additional spokes and may reduce the likelihood of resistive heating hot spots due to high current loads at a given location. In embodiments in which the spokes taper outward from the central axis of bridge mesh 430, the outer ends of each spoke may be between about 1.5 and 10 times wider than an inner end of the spoke, between about 2 and 8 times, between about 2.5 and 7 times, between 3 and 6 times, or between 4 and 5 times wider than an inner end of the spoke.

In some embodiments, the bridge mesh 430 may be positioned below first bipolar electrode 405 and/or the second bipolar electrode 410 by a distance of between about 1 mm and 10 mm, between about 2 mm and 9 mm, between about 3 mm and 8 mm, between about 4 mm and 7 mm, or between about 5 mm and 6 mm. In some embodiments, the heater 455 may be spaced apart (e.g., below) from the bridge mesh 430 by between about 1 mm and 15 mm, between about 2 mm and 13 mm, between about 3 mm and 11 mm, between about 4 mm and 9 mm, or between or about 5 mm and 7 mm. Smaller distances than these ranges may result in too much RF and/or DC current leakage, while larger distances may result in needing larger/more powerful heaters, which increase costs and power usage. Moreover, as will be discussed in greater detail below, the present disclosure has surprisingly found that by carefully controlling the distance between respective bridge meshes, as well as the respective width of the first and second electrode, a carefully selected and tailored DC current may be induced in RF electrode 460 without requiring a third DC power source.

Nonetheless, as illustrated, arrangement 400 includes an RF electrode 460, which may be located or positioned radially outward from the first bipolar electrode 405 and the second bipolar electrode 410, and may extend about the bipolar electrodes as illustrated. The RF electrode 460 may be coaxial with one or both of the first bipolar electrode 405 and the second bipolar electrode 410. The RF electrode 460 may have a generally annular mesh 470 having an outer periphery that extends beyond the peripheral edges of the first bipolar electrode 405 and the second bipolar electrode 410. For example, an outer diameter of the RF electrode 460 may be between about 12.5 inches and 16 inches, between about 13 inches and 15.5 inches, between about 13.5 inches and 15 inches, or between or about 14 inches and 14.5 inches. Moreover, mesh 470 may have any one or more of the features discussed in regards to bridge mesh 430 discussed above.

In such embodiments, a diameter of an inner opening of the mesh be sized to minimize or eliminate a gap between the inner edge of the mesh of the RF electrode 460 and an outer edge of the first bipolar electrode 405. For example, the inner edge of the mesh of the RF electrode 460 may be less than 5 mm, less than 4 mm, less than 3 mm, less than 2 mm, less than 1 mm, or less from an outer edge of the first bipolar electrode 405. In some embodiments the RF electrode 460 may be fully or partially disposed beneath the exterior region 347, for example, or may otherwise be about an edge region of the substrate support.

In embodiments, the mesh 470 of the RF electrode 460 may be disposed below the meshes of the bipolar electrodes or between the meshes of the bipolar electrodes (e.g. between the second electrode 410 and first electrode 405 bridge mesh 430). Namely, the present technology has found that by controlling the vertical and/or horizontal distance between bridge mesh 430 of first electrode 405, such as an electrode having a negative DC current, in embodiments, and mesh 470 of the RF electrode 460, the induced voltage may be further tailored. For instance, without wishing to be bound by theory, due at least in part to the asymmetry between the first electrode 405 and second electrode 410 discussed above, a closed loop circuit may develop between bridge mesh 430 and mesh 470. Such a phenomenon may be due at least in part to the conductivity of material of the substrate support at processing temperatures. Nonetheless, by controlling the linear distance/in one more directions (e.g. a shortest distance) between bridge mesh 430 and mesh 470, the DC voltage may be induced or further controlled. As illustrated, in embodiments, the linear distance/may be horizontally between a lead 464 and a lateral end of bridge mesh 430 and/or may be vertically between bridge mesh 430 and mesh 470. While mesh 470 is shown disposed vertically below bridge mesh 430, it should be understood that the dimensions discussed herein may also be achieved when mesh 470 is disposed vertically above bridge mesh 430.

Nonetheless, in embodiments, the linear distance/(e.g. a radial gap) is a shortest dimension between mesh 470 bridge mesh 430 may be a distance of greater than or about 0.75 mm, such as greater than or about 1 mm, such as greater than or about 1.1 mm, such as greater than or about 1.2 mm, such as greater than or about 1.3 mm, such as greater than or about 1.4 mm, such as greater than or about 1.5 mm, such as greater than or about 1.6 mm, such as greater than or about 1.7 mm, such as greater than or about 1.8 mm, such as greater than or about 1.9 mm, such as greater than or about 2 mm, such as greater than or about 2.2 mm, such as greater than or about 2.4 mm, such as greater than or about 2.6 mm, such as greater than or about 2.8 mm, such as greater than or about 3 mm, such as greater than or about 3.2 mm, such as greater than or about 3.4 mm, such as greater than or about 3.6 mm, such as greater than or about 3.8 mm, such as greater than or about 4 mm, such as greater than or about 4.2 mm, such as greater than or about 4.4 mm, such as greater than or about 4.6 mm, such as greater than or about 4.8 mm, such as greater than or about 5 mm, such as greater than or about 5.5 mm, such as greater than or about 6 mm, such as greater than or about 6.5 mm, such as greater than or about 7 mm, such as greater than or about 7.5 mm, such as up to about 8 mm, such as less than or about 7.75 mm, such as less than or about 7.5 mm, such as less than or about 7.25 mm, such as less than or about 7 mm, such as less than or about 6.75 mm, such as less than or about 6.5 mm, such as less than or about 6.25 mm, such as less than or about 6 mm, such as less than or about 5.75 mm, such as less than or about 5.5 mm, such as less than or about 5.25 mm, such as less than or about 5 mm, such as less than or about 4.75 mm, such as less than or about 4.5 mm, such as less than or about 4.25 mm, such as less than or about 4 mm, such as less than or about 3.75 mm, such as less than or about 3.5 mm, such as less than or about 3.25 mm, such as less than or about 3 mm, or any ranges or values therebetween between. Thus, in embodiments, the lateral about 1 mm and 8 mm, between about 1.5 mm and 6 mm, between about 2 mm and 5 mm, or between about 2.5 mm and 3.5 mm.

Electrode leads 464 may couple an RF power source with the RF electrode 460 at one or more positions 465 as illustrated. Although four such lead positions are illustrated, any number of leads may be provided in embodiments to ensure uniform delivery to the electrode. The leads may be provided at regular intervals about the RF electrode 460 to provide a symmetrical arrangement that may promote a uniform RF flow across the substrate support surface.

In embodiments, the lead connections may be provided using mesh 470, which may have a similar structure as a spoked connector discussed above, but extends radially outward to be aligned with the RF electrode 460. Nonetheless, in embodiments, mesh 470 may be generally continuous. RF electrode 460 may be coupled with an RF power source, but may be DC floated (e.g., not coupled with a DC power source), as discussed above. In some embodiments, one or more of the leads that couple the first electrode and/or the second electrode with the respective power source may extend through the mesh 470. Moreover, in embodiments, one or more conductive elements 450 may extend through mesh 470 if mesh 470 is disposed above bridge mesh 430. For example, the bridge mesh 470 may define one or more apertures through a thickness of the bridge mesh 470 that enable leads, rods, and/or other electrical connectors to pass through the bridge mesh 470 to couple with the second bipolar electrode 410, first bipolar electrode 405, as well as other components discussed herein.

Nonetheless, the present technology has surprisingly found that by carefully controlling the length of electrode leads 464, and therefore a distance d between the mesh 470 and RF electrode 460 (e.g. a vertical gap), selected induced voltage ranges may be obtained at RF electrode 460. For instance, in embodiments, the distance d may be greater than or about 0.5 mm, such as greater than or about 0.6 mm, such as greater than or about 0.7 mm, such as greater than or about 0.8 mm, such as greater than or about 0.9 mm, such as greater than or about 1 mm, such as greater than or about 1.1 mm, such as greater than or about 1.2 mm, such as greater than or about 1.3 mm, such as greater than or about 1.4 mm, such as greater than or about 1.5 mm, such as greater than or about 1.6 mm, such as greater than or about 1.7 mm, such as greater than or about 1.8 mm, such as greater than or about 1.9 mm, such as greater than or about 2 mm, such as greater than or about 2.2 mm, such as greater than or about 2.4 mm, such as greater than or about 2.6 mm, such as greater than or about 2.8 mm, such as greater than or about 3 mm, such as greater than or about 3.2 mm, such as greater than or about 3.4 mm, such as greater than or about 3.6 mm, such as greater than or about 3.8 mm, such as greater than or about 4 mm, such as greater than or about 4.2 mm, such as greater than or about 4.4 mm, such as greater than or about 4.6 mm, such as greater than or about 4.8 mm, such as greater than or about 5 mm, such as greater than or about 5.5 mm, such as greater than or about 6 mm, such as greater than or about 6.5 mm, such as greater than or about 7 mm, such as greater than or about 7.5 mm, such as up to about 8 mm, or any ranges or values therebetween.

Such values may allow excellent modulation of the floating RF electrode without interfering with further meshes contained in the substrate support, such as a heater mesh.

By providing such distances d it was found that floating DV voltages of about 200 V to about −600 V may be obtained at RF electrode 460 without requiring a power source. Thus, in embodiments, RF electrode 460 may exhibit a floating DC voltage of less than or about 150 V, such as less than or about 100 V, such as less than or about 50 V, such as less than or about 0 V, such as less than or about −25 V, such as less than or about −50 V, such as less than or about −75 V, such as less than or about −100 V, such as less than or about −125 V, such as less than or about −150 V, such as less than or about −175 V, such as less than or about −200 V, such as less than or about −225 V, such as less than or about −250 V, such as less than or about −275 V, such as less than or about −300 V, such as less than or about −325 V, such as less than or about −350 V, such as less than or about −375 V, such as less than or about −400 V, such as less than or about −425 V, such as less than or about −450 V, such as less than or about −475 V, such as less than or about −500 V, such as less than or about −525 V, such as less than or about −500 V, or any ranges or values therebetween. Thus, in embodiments, the present technology allows for the selection of a desired voltage, as well as a self-induced negative DC current at a floating electrode, providing improved protection and performance at an edge region without requiring an additional power supply.

While further modulations may be discussed to tailor the floating DC voltage at RF electrode 460, in embodiments, smaller distances d may allow for a smaller negative floating DC voltage (e.g. less than or about −100 V, or less than or about −50 V) or a positive floating DC voltage to be obtained at RF electrode 460. For instance, in embodiments, when it may be desired to obtain positive floating DC voltages or smaller negative floating DC voltage, a distance d may be controlled to be less than or about 1.25 mm, such as less than or about 1.2 mm, such as less than or about 1.1 mm, such as less than or about 1 mm, such as less than or about 0.9 mm, such as less than or about 0.8 mm, such as about 0.75 mm, or any ranges or values therebetween.

Moreover, while further modulates may be discussed below to tailor the floating DC voltage at RF electrode 460, in embodiments, larger distances d may allow for a larger negative floating DC voltage (e.g. less than or about −50 V, or less than or about −100V, or less such as down to even about −600 V, as discussed above) be obtained at RF electrode 460. For instance, in embodiments, when it may be desired to obtain a negative floating DC voltage, a distance d may be controlled to be greater than or about 1 mm, such as greater than or about 1.1 mm, such as greater than or about 1.2 mm, such as greater than or about 1.3 mm, such as greater than or about 1.4 mm, such as greater than or about 1.5 mm, such as greater than or about 1.6 mm, such as greater than or about 1.7 mm, such as greater than or about 1.8 mm, such as greater than or about 1.9 mm, such as greater than or about 2 mm, such as greater than or about 2.2 mm, such as greater than or about 2.4 mm, such as greater than or about 2.6 mm, such as greater than or about 2.8 mm, such as greater than or about 3 mm, such as greater than or about 3.2 mm, such as greater than or about 3.4 mm, such as greater than or about 3.6 mm, such as greater than or about 3.8 mm, such as greater than or about 4 mm, such as greater than or about 4.2 mm, such as greater than or about 4.4 mm, such as greater than or about 4.6 mm, such as greater than or about 4.8 mm, such as greater than or about 5 mm, such as greater than or about 5.5 mm, such as greater than or about 6 mm, such as greater than or about 6.5 mm, such as greater than or about 7 mm, such as greater than or about 7.5 mm, such as up to about 8 mm, such as less than or about 7.75 mm, such as less than or about 7.5 mm, such as less than or about 7.25 mm, such as less than or about 7 mm, such as less than or about 6.75 mm, such as less than or about 6.5 mm, such as less than or about 6.25 mm, such as less than or about 6 mm, such as less than or about 5.75 mm, such as less than or about 5.5 mm, such as less than or about 5.25 mm, such as less than or about 5 mm, such as less than or about 4.75 mm, such as less than or about 4.5 mm, such as less than or about 4.25 mm, such as less than or about 4 mm, or any ranges or values therebetween.

In embodiments, both the radial gap and the vertical gap may be varied together or independently to control the induced voltage. For instance, in embodiments, both a radial gap and a vertical gap may be increased to increase a negative induced voltage. Moreover in embodiments, both the radial gap and vertical gap may be decreased to obtain a smaller negative induced voltage or a positive induced voltage. In embodiments, the radial gap and vertical gap may be independently altered (e.g. one increased and one decreased), to further tune the voltages Surprisingly, the present technology has found that such modulation is possible without requiring large changes, if any, to the chucking voltages applied to the first electrode 405 and second electrode 410. In such a manner, a floating DC voltage may be applied to RF electrode 460 without requiring an increase or decrease in the chucking voltage. This allows excellent protection of the substrate support due to the negative voltage at first electrode 405, as well as increased protection at RF electrode, without increasing the risk of wafer backside damage due to changes in the chucking voltage. Thus, in embodiments, the chucking voltage of the first electrode 405 and second electrode 410 may be selected based upon the desired chucking force, and may have an absolute value, as an example only, of about 800 V to about 1000 V, such as about 850 V to about 950 V, or any ranges or values therebetween.

Regardless, when a heater is utilized, such as heater 455, the heater should be spaced apart so as to not interfere with the first electrode 405, second electrode 410, and/or RF electrode 460. In embodiments, the heater 455 may be spaced apart (e.g., below) from the mesh 470 by between about 1 mm and 15 mm, between about 2 mm and 13 mm, between about 3 mm and 11 mm, between about 4 mm and 9 mm, or between or about 5 mm and 7 mm. Smaller distances than these ranges may result in too much RF and/or DC current leakage, while larger distances may result in needing larger/more powerful heaters, which increase costs and power usage.

Each of the electrodes may be coupled with one or more power supplies as can be seen in FIG. 4B. As shown, the arrangement 400 may include the first bipolar electrode 405 and second bipolar electrode 410. Each electrode may be coupled with one or more power supplies as previously described, and FIG. 4B illustrates an exemplary coupling arrangement, although it is to be understood that any number of electrode coupling configurations may be used. For example, the first bipolar electrode 405 may be coupled with a first DC power supply 490 (such as bridge mesh 430), and the second bipolar electrode 410 may be coupled with a second DC power supply 485 (such as via a DC rod or lead that extends up to the second bipolar electrode 410). Either power supply may be operated in a positive or negative voltage arrangement. This may enable the two bipolar electrodes to be operated with opposite polarities to chuck a wafer.

For example, the first bipolar electrode 405 may be supplied with a negative current, while the second bipolar electrode 410 may be supplied with a positive current of equal magnitude, or vice versa. In some embodiments, the polarity of current supplied to each bipolar electrode may be switched during processing, for example, as well as increased or decreased in either direction to provide electrostatic chucking. Each power supply may be floating (ungrounded), which eliminates a relative voltage differential between the electrodes and chamber surroundings, such as chamber sidewalls. One or more RF power supplies may also be incorporated in some embodiments. For example, an RF power supply 495 may be coupled with the first bipolar electrode 405 (such as via the bridge mesh 430 or another mesh) and the second bipolar electrode 410 (such as via an RF rod that extends up to the second bipolar electrode 410). Although a separate RF power supply may be coupled with each of the bipolar electrodes, in some embodiments a single power supply may be used based on the configuration of the electrodes. The RF power supply 495 (or a separate RF power source) may also be coupled with the RF electrode 460, such as via mesh 470. In some embodiments, the first bipolar electrode 405 and the second bipolar electrode 410 may have substantially (e.g., within 10%, within 5%, within 3%, within 1%, or less) the same area.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the mesh" includes reference to one or more meshes and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:
an electrostatic chuck body defining a substrate support surface that defines a substrate seat;
a support stem coupled with the electrostatic chuck body;
a first bipolar electrode embedded within the electrostatic chuck body;
a second bipolar electrode embedded within the electrostatic chuck body radially inward of at least a portion of the first bipolar electrode and coaxial with the first bipolar electrode, and
an annular electrode disposed about the first bipolar electrode, wherein the annular electrode is DC floated and RF powered and exhibits an induced DC current.

2. The substrate support assembly of claim 1, further comprising:
a mesh disposed within the electrostatic chuck body, the mesh coupling the annular electrode with an RF power supply, wherein one or more leads couple the mesh with the annular electrode.

3. The substrate support assembly of claim 2, wherein:
a distance between the mesh and the annular electrode is from about 0.6 mm to about 8 mm.

4. The substrate support assembly of claim 3, wherein:
the distance between the mesh and the annular electrode is from about 1 mm to about 4.5 mm.

5. The substrate support assembly of claim 4, wherein:
the annular electrode exhibits a negative floating DC voltage of less than 0 V to about −600 V.

6. The substrate support assembly of claim 2, further comprising:
a bridge mesh disposed within the electrostatic chuck body, the bridge mesh coupling the first bipolar electrode with a DC power supply, wherein one or more leads couple the bridge mesh with the first bipolar electrode.

7. The substrate support assembly of claim 6, wherein:
the bridge mesh is spaced apart from the mesh of the annular electrode by an amount of at least about 0.6 mm to about 8 mm.

8. The substrate support assembly of claim 1, wherein:
the first bipolar electrode comprises a generally annular shape; and
the second bipolar electrode comprises a generally circular shape.

9. The substrate support assembly of claim 8, wherein:
the first bipolar electrode has a first surface area and the second bipolar electrode has a second surface area, wherein the first surface area and the second surface area vary by less than or about 10%.

10. The substrate support assembly of claim 9, wherein:
the second bipolar electrode has a radial width and the first bipolar electrode has a width along a radius of the substrate support surface, wherein the radial width of the second bipolar electrode is greater than a width of the first bipolar electrode.

11. The substrate support assembly of claim 1, wherein:
each of the first bipolar electrode and the second bipolar electrode is coupled with at least one RF power supply;
each of the first bipolar electrode and the second bipolar electrode is coupled with at least one DC power supply; and all of the second bipolar electrode is disposed radially inward of the first bipolar electrode.

12. A substrate support assembly, comprising:

an electrostatic chuck body defining a substrate support surface that defines a substrate seat;

a support stem coupled with the electrostatic chuck body;

a first bipolar electrode embedded within the electrostatic chuck body;

a second bipolar electrode embedded within the electrostatic chuck body radially inward of at least a portion of the first bipolar electrode and coaxial with the first bipolar electrode, an annular electrode disposed about the first bipolar electrode, wherein the annular electrode is DC floated and RF powered; and a mesh disposed within the electrostatic chuck body, the mesh coupling the annular electrode with an RF power supply, wherein a distance between the mesh and the annular electrode is from about 0.6 mm to about 8 mm.

13. The substrate support assembly of claim 12, wherein:

wherein a distance between the mesh and the annular electrode is from about 0.75 mm to about 1.5 mm and the annular electrode exhibits a floating DC voltage of about 100 V to about −100 V.

14. The substrate support assembly of claim 12, wherein:

a distance between the mesh and the annular electrode is from about 1.5 mm to about 6 mm and the annular electrode exhibits a floating DC voltage of about −50 V to about −600 V.

15. The substrate support assembly of claim 14, wherein:

the distance between the mesh and the annular electrode is from about 1.5 mm to about 4.5 mm.

16. The substrate support assembly of claim 12, further comprising:

a bridge mesh disposed within the electrostatic chuck body, the bridge mesh coupling the first bipolar electrode with a DC power supply, wherein one or more leads couple the bridge mesh with the first bipolar electrode.

17. The substrate support assembly of claim 16, wherein:

the bridge mesh is spaced apart from the mesh of the annular electrode by an amount of at least about 0.6 mm to about 8 mm.

18. A substrate support assembly, comprising:

an electrostatic chuck body defining a substrate support surface that defines a substrate seat;

a support stem coupled with the electrostatic chuck body;

a first bipolar electrode embedded within the electrostatic chuck body, wherein the first bipolar electrode is coupled with at least one DC power supply and is supplied with a negative DC current;

a second bipolar electrode embedded within the electrostatic chuck body wherein an entirety of the second bipolar electrode is radially inward of at least a portion of the first bipolar electrode and the second bipolar electrode is coaxial with the first bipolar electrode, and an annular electrode disposed about the first bipolar electrode, wherein the annular electrode is DC floated and RF powered and exhibits an induced DC current.

19. The substrate support assembly of claim 18, further comprising:

a mesh disposed within the electrostatic chuck body, the mesh coupling the annular electrode with an RF power supply, wherein a distance between the mesh and the annular electrode is from about 0.6 mm to about 8 mm.

20. The substrate support assembly of claim 19, further comprising:

a bridge mesh disposed within the electrostatic chuck body, the bridge mesh coupling the first bipolar electrode with a DC power supply, wherein the mesh is disposed vertically above or below the bridge mesh.

* * * * *